United States Patent
Mietus et al.

(10) Patent No.: US 8,117,378 B2
(45) Date of Patent: Feb. 14, 2012

(54) PREVENTING UNINTENDED PERMANENT WRITE-PROTECTION

(75) Inventors: David Francis Mietus, Maricopa, AZ (US); Bruce Edward Beauchamp, Gilbert, AZ (US); Samuel Alexander, Phoenix, AZ (US); Ezana H. Aberra, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 650 days.

(21) Appl. No.: 12/260,188

(22) Filed: Oct. 29, 2008

(65) Prior Publication Data

US 2010/0106891 A1    Apr. 29, 2010

(51) Int. Cl.
*G06F 12/14* (2006.01)
*G11C 16/22* (2006.01)

(52) U.S. Cl. .................................. 711/103; 365/185.04
(58) Field of Classification Search .................. None
See application file for complete search history.

(56) References Cited

U.S. PATENT DOCUMENTS

| | | | |
|---|---|---|---|
| 4,975,883 A | 12/1990 | Baker et al. ................ | 365/226 |
| 5,594,686 A | 1/1997 | Hazen et al. ............ | 365/185.04 |
| 5,896,324 A | 4/1999 | Jang et al. ................ | 365/189.07 |
| 6,038,190 A | 3/2000 | Kowalski et al. ............ | 365/228 |
| 6,654,847 B1 | 11/2003 | Roohparvar et al. ......... | 711/103 |
| 6,731,536 B1 | 5/2004 | McClain et al. ......... | 365/185.04 |
| 7,155,589 B2 * | 12/2006 | Chevallier et al. ............ | 711/163 |

FOREIGN PATENT DOCUMENTS

| | | |
|---|---|---|
| WO | 2006/039075 A1 | 4/2006 |
| WO | 2008/075292 A2 | 6/2008 |

OTHER PUBLICATIONS

International PCT Search Report and Written Opinion, PCT/US2009/062156, 15 pages, Mailed Feb. 9, 2010.
"ST93CS46 Serial Access CMOS 1K bit (64×16) EEPROM", in "Memory Products Data Book, $2^{nd}$ Edition", SGS-Thompson Microelectronics, pp. 479-489, XP002564862, Aug. 1992.
"Memory Module Serial Presence-Detect" from URL:http://download.micron.com/pdf/technotes/TN_04_42, Section "Write Protection", pp. 5-6.

\* cited by examiner

*Primary Examiner* — Gary J Portka
(74) *Attorney, Agent, or Firm* — King & Spalding L.L.P.

(57) ABSTRACT

An input voltage range may be established between different voltage levels used for different programming functions of an integrated circuit device, thus implementing a protection zone ("safe zone") of non-operation to facilitate prevention of an unintended irreversible programming operation, e.g., permanent write protection.

13 Claims, 5 Drawing Sheets

VIH, min = 0.7 * Vdd         VHH, min = 7 volts
VIL, max = 0.3 * Vdd         VIH, max = Vdd + 0.5 volts (a)

(b)

| Command | Address Pins | | | Control Byte | | | | | | | |
|---|---|---|---|---|---|---|---|---|---|---|---|
| | A2 | A1 | A0 | B7 | B6 | B5 | B4 | B3 | B2 | B1 | B0 |
| SWP | VSS | VSS | >VHH min | 0 | 1 | 1 | 0 | 0 | 0 | 1 | 0 |
| No Fuse Operation | VSS | VSS | Safe-Zone | 0 | 1 | 1 | 0 | 0 | 0 | 1 | 0 |
| PSWP | A2 | A1 | <VIH max | 0 | 1 | 1 | 0 | A2 | A1 | A0 | 0 |

FIGURE 4

| Command | Address Pins | | | Control Byte | | | | | | | |
|---|---|---|---|---|---|---|---|---|---|---|---|
| | A2 | A1 | A0 | B7 | B6 | B5 | B4 | B3 | B2 | B1 | B0 |
| SWP | VSS | VSS | VHV | 0 | 1 | 1 | 0 | 0 | 0 | 1 | 0 |
| PSWP | A2 | A1 | A0 | 0 | 1 | 1 | 0 | A2 | A1 | A0 | 0 |

| Symbol | Parameter | Test Condition | Min | Max | Units |
|---|---|---|---|---|---|
| VHV | SA0 high voltage | VHV-VDDSD ≥ 4.8 V | 7 | 10 | V |

FIGURE 5
(Prior Technology)

PREVENTING UNINTENDED PERMANENT WRITE-PROTECTION

TECHNICAL FIELD

The present disclosure relates to integrated circuit devices having programmable non-volatile memory, and more particularly, to programmable non-volatile memory capable of temporary and permanent write protection.

BACKGROUND

Integrated circuit devices having non-volatile memory may store operating parameters of the device, operating programs and/or fixed data in the non-volatile memory. The non-volatile memory may be write protected so as to prevent unauthorized and/or inadvertent changes to the contents therein. A number of means are available to write-protect non-volatile memory and are collectively referred to herein as "write-protect fuses." Two types of write-protect fuses may be implemented with a non-volatile memory, a) a temporary write-protect fuse that allows a user clear function (disable write-protection), and b) a permanent write-protect fuse that permanently places the non-volatile memory in a write-protected mode without the user being able to clear the permanent write-protect. Thus once a device has been programmed and permanently write-protected, the device program cannot be altered thereafter.

Typically, an integrated circuit device will have a multi-function pin (external connection) that may be utilized for either normal operation of the integrated circuit or programming operations thereto. The multi-function pin may be further characterized as requiring different voltage levels, e.g., use of a higher voltage then the operating voltage to perform a semi-permanent or permanent programming operation.

According to the JEDEC Solid State Technology Association Specification for Serial Presence Detection (SPD) electrically erasable and programmable read only memory (EEPROM), when attempting to program a temporary write-protect fuse using the SWP (software write protect) command, if a high voltage, VHV, on the A0 address pin of the device is not at a high enough voltage for completing the temporary write-protection (SWP) command, then the device will have its permanent write-protect fuse set, e.g., execute the permanent software write protect (PSWP) command instead. This results in the device being permanently write-protected, and would require the device to be physically replaced if a program change and/or correction had to be implemented thereto.

Referring to FIG. 5, depicted is a table of voltages and logic levels associated with a prior technology external multifunction input-output connection used to perform temporary write-protection (SWP) and permanent software write protect (PSWP) commands. When attempting to program a temporary write protection (fuse) using the SWP command, if the VHV level applied to the A0 input connection is insufficient, the integrated circuit device will inadvertently program the permanent write protection (fuse), i.e., execute the PSWP command instead. This renders the integrated circuit device permanently write protected.

SUMMARY

Therefore, a need exists to prevent an undesired programming operation, e.g., permanent write protect, occurring inadvertently due to marginal voltage tolerances of the various programming functions. According to the teachings of this disclosure, a range, e.g., "window," may be established between different voltage levels used for different programming functions of an integrated circuit device, thus implementing a protection zone ("safe zone") of non-operation to facilitate prevention of an unintended irreversible programming operation, e.g., permanent write protection.

According to a specific example embodiment of this disclosure, an integrated circuit device having a nonvolatile programmable memory comprises: nonvolatile memory; memory control and programming logic coupled to the nonvolatile memory and adapted for writing data to the nonvolatile memory; at least one multifunction input connection coupled to the memory control and programming logic, wherein the at least one multifunction input is used to enable write protection of the data written to the nonvolatile memory; wherein the write protection comprises permanent write protection when a voltage on the at least one multifunction input is less than a first voltage value, and temporary write protection when the voltage on the at least one multifunction input is greater than a second voltage value, the second voltage value being greater than the first voltage value; and wherein the write protection cannot be enabled when the voltage on the at least one multifunction input is equal to or greater than the first voltage value and less than or equal to the second voltage value.

According to another specific example embodiment of this disclosure, a method for preventing unintended permanent write-protection of a nonvolatile programmable memory in an integrated circuit device comprises: comparing a voltage on an input of a multifunction input connection of an integrated circuit device to first and second voltage values, wherein the second voltage value is greater than the first voltage value; if the voltage on the input of the multifunction input connection is less than the first voltage value, then allow permanent write protection of a programmable memory in the integrated circuit device; if the voltage on the input of the multifunction input connection is greater than the second voltage value, then allow temporary write protection of the programmable memory in the integrated circuit device; and if the voltage on the input of the multifunction input connection is equal to or greater than the first voltage value and less then or equal to the second voltage, then do not allow write protection of the programmable memory.

BRIEF DESCRIPTION OF THE DRAWINGS

A more complete understanding of the present disclosure may be acquired by referring to the following description taken in conjunction with the accompanying drawings wherein:

FIG. 4 is a table of voltages and logic levels associated with the integrated circuit device of FIG. 1 and the circuit shown in FIG. 2, according to the teachings of this disclosure; and FIG. 5 is a table of voltages and logic levels associated with a prior technology external multifunction input-output connection used to perform temporary write-protection (SWP) and permanent software write protect (PSWP) commands.

DETAILED DESCRIPTION

Figure 1:
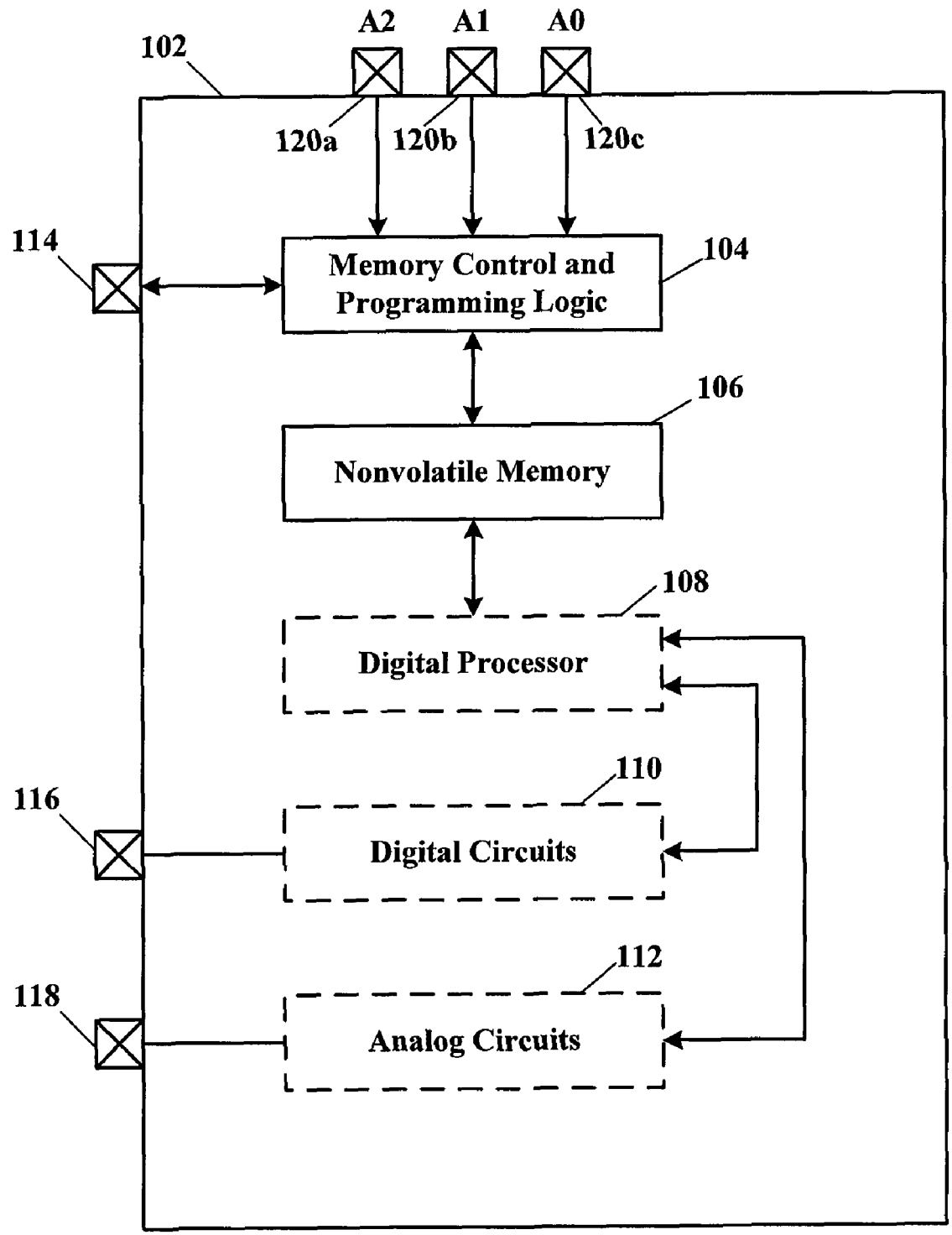
FIG. 1 is a schematic block diagram of an integrated circuit device having at least one external multifunction input-output connection on an integrated circuit package.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of an integrated circuit device having at least one external multifunction input-output connection on an integrated circuit package. The integrated circuit device 102 comprises memory control and programming logic 104, a nonvolatile memory 106, and external connections, e.g., connections 114 and 120 et al. At least one of the external connections, e.g., connection 120c, may be a multifunction input, output or input-output connection. According to the teachings of this disclosure, the at least one multifunction connection may have primary and secondary functions, such as, for example but not limited to, an address selection input(s) (primary); and nonvolatile memory write protection, both temporary and permanent (secondary), e.g., for setting "fuses" for erasable and non-erasable protection of the program contents of the nonvolatile memory 106.

The integrated circuit device 102 may further comprises a digital processor 108, digital circuits 110, and/or analog circuits 112. External input and/or output connections 116 and 118 are coupled to the digital circuits 110 and analog circuits 112, respectively.

Figure 2:
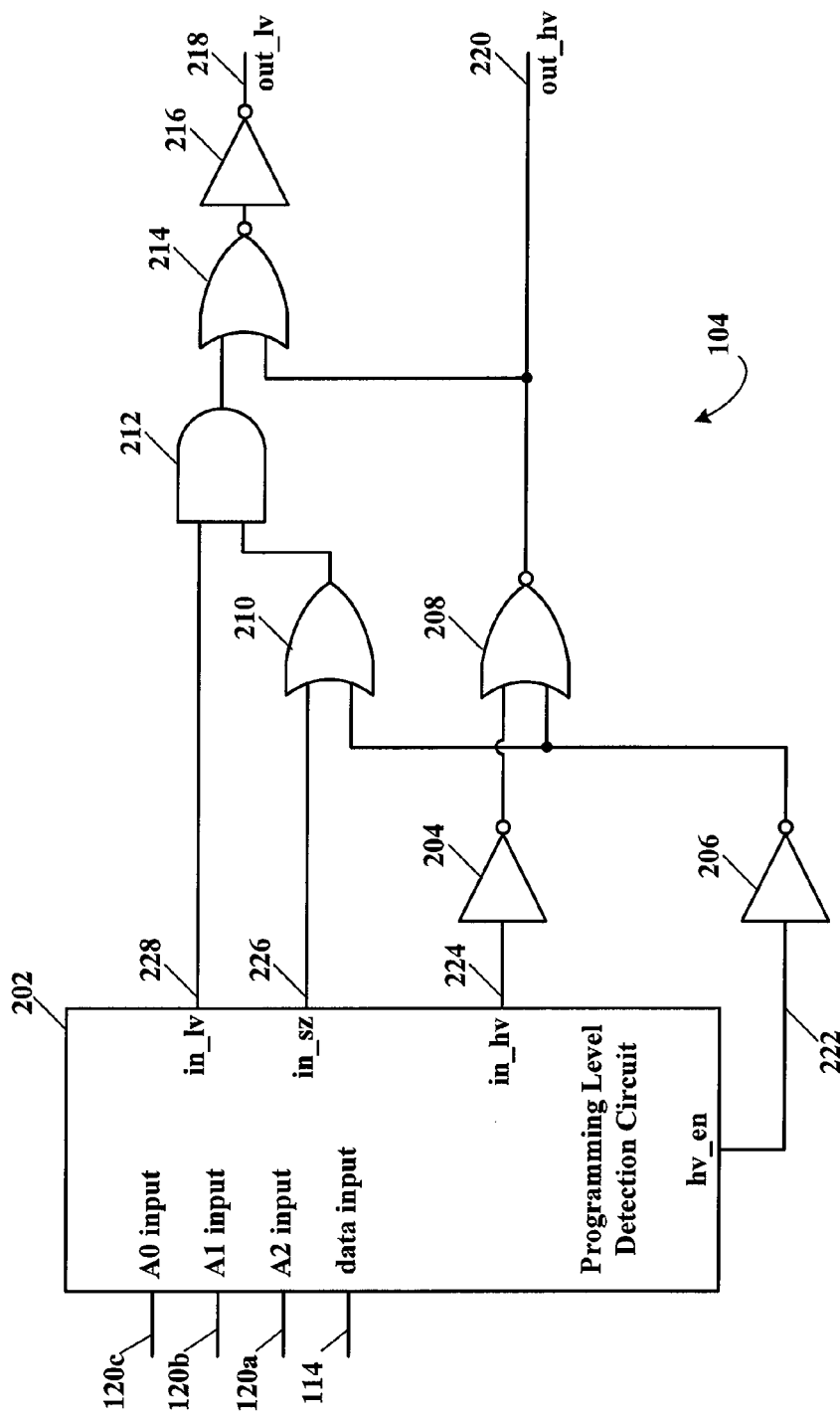
FIG. 2 is a schematic diagram of a logic circuit for implementing a non-operational window for the at least one external multifunction connection, according to a specific example embodiment of this disclosure.

Referring to FIG. 2, depicted is a schematic diagram of a logic circuit for implementing a non-operational window for the at least one external multifunction connection, according to a specific example embodiment of this disclosure. The external connections 114, 120a, 12b and 120c have a secondary function that may be used in conjunction with programming and write protecting the programmed nonvolatile memory 106. The combinatorial logic gates 204-216 are representative of one specific example embodiment, according to the teachings of this disclosure, and it is contemplated and within the scope of this disclosure that any logic design may be used as would be readily apparent to one having ordinary skill in digital logic design and the benefit of this disclosure.

Figure 3:
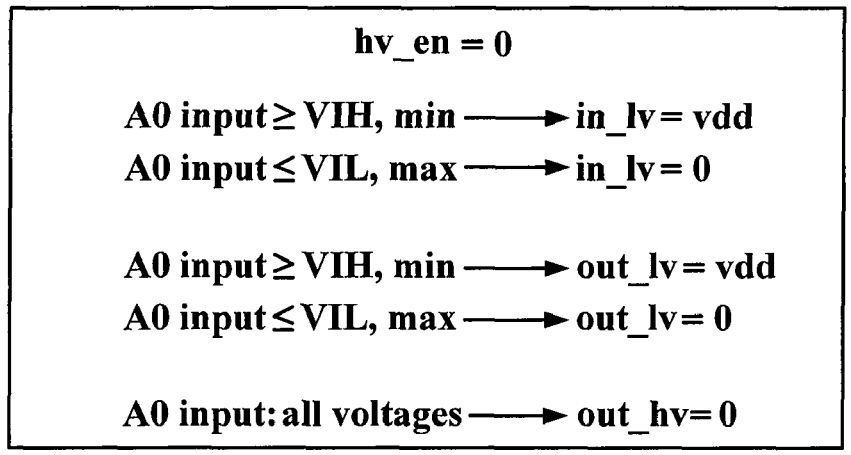
FIG. 3 are tables of relationships of various voltage level inputs and logic outputs of the circuit shown in FIG. 2, according to the teachings of this disclosure.
Figure 3:
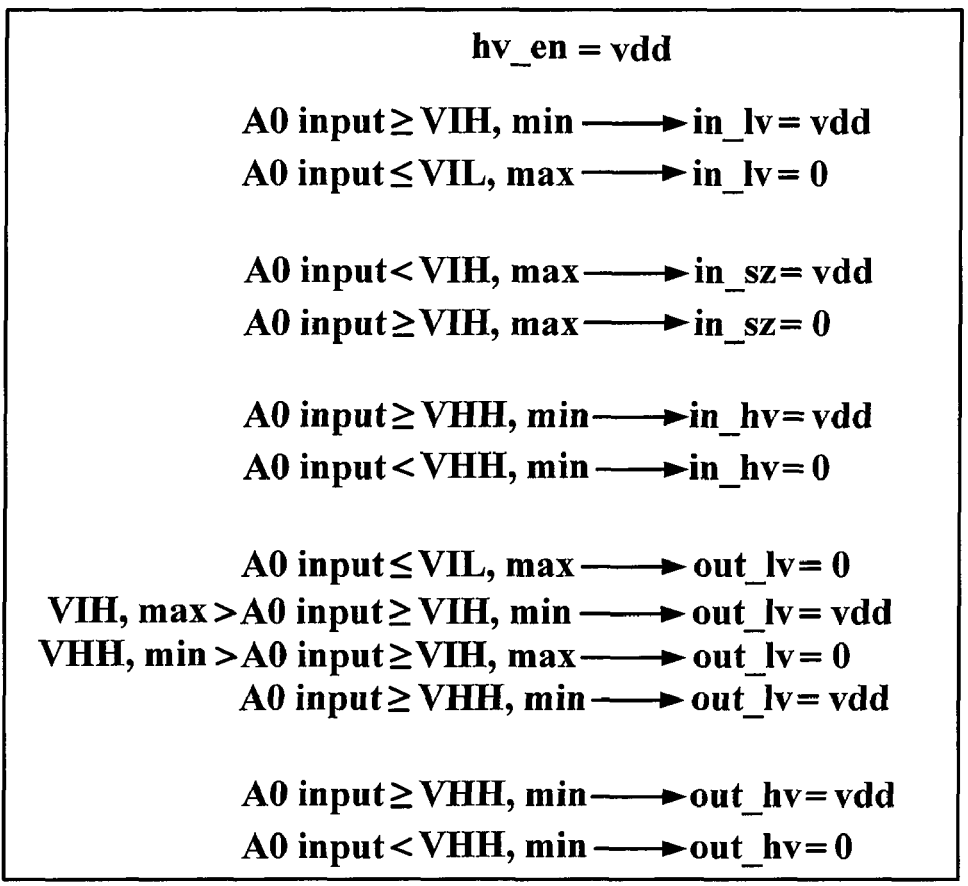

Referring to FIG. 3, depicted are tables of relationships of various voltage level inputs and logic outputs of the circuit shown in FIG. 2, according to the teachings of this disclosure. Disclosed for illustrative purposes are voltage values VIH, min=0.7*Vdd; VIL, max=0.3*Vdd; VIH, max=Vdd+0.5 volts; VHH, min=7 volts; and Vdd is the power source voltage. It is contemplated and within the scope of this disclosure that other voltage values and their relationships may be used and be within the scope and intent of this disclosure.

In Table 3(a) when the hv_en signal line 222 is at a logic "0," the out_hv signal line 220 is always at a logic "0" for all voltage values applied to the multifunction A0 input (connection 120c). The out_lv signal line 218 follows the in_lv signal line 228 as being at a logic "1" when the voltage on the multifunction A0 input (connection 120c) is greater than or equal to VIH, min; and at a logic "0" when the voltage on the multifunction A0 input (connection 120c) is less than or equal to VIL, max.

In Table 3(b) when the hv_en signal line 222 is at a logic "1," the in_lv signal line 228 is at a logic "1" when the voltage on the multifunction A0 input (connection 120c) is greater than or equal to VIH, min; and at a logic "0" when the voltage on the multifunction A0 input (connection 120c) is less than or equal to VIL, max. The in_sz (safe zone) signal line 226 will be at a logic "1" when the voltage on the multifunction A0 input (connection 120c) is less than VIH, max, and at a logic "0" when the voltage on the multifunction A0 input (connection 120c) is greater than or equal to VIH, max. The in_hv signal line 224 will be at a logic "1" when the voltage on the multifunction A0 input (connection 120c) is greater than or equal to VHH, min, and at a logic "0" when the voltage on the multifunction A0 input (connection 120c) is less than VHH, min.

The out_lv signal line 218 will be at a logic "0" when the voltage on the multifunction A0 input (connection 120c) is less than or equal to VIL, max; or less than VHH, min, and greater than or equal to VIH, max. The out_lv signal line 218 will be at a logic "1" when the voltage on the multifunction A0 input (connection 120c) is greater than VHH, min; or less than VIH, max, and greater than or equal to VIH, min.

The out_hv signal line 220 will be at a logic "1" when the voltage on the multifunction A0 input (connection 120c) is greater than or equal to VHH, min; and at a logic "0" when the voltage on the multifunction A0 input (connection 120c) is less than VHH, min. The use of signal lines 222, 224, 226 and 228 combined with logic gates 204-216 create the "safe zone" where any form of write protection is inhibited. The safe zone will be, according to this specific example embodiment, when the voltage on the multifunction A0 input (input 120c) is less than VHH, min; but greater than or equal to VIH, max.

Referring to FIG. 4, depicted is a table of voltages and logic levels associated with the integrated circuit device of FIG. 1 and the circuit shown in FIG. 2, according to the teachings of this disclosure. The aforementioned logic of FIG. 2 thereby creates a safe zone between VHH, min; and VIH, max; in which neither a temporary (SWP) memory write protection or a permanent (PSWP) memory write protection can occur. When the voltage on the multifunction A0 input (connection 120c) is greater than VHH, min; a temporary (SWP) memory write protection can occur, and when the voltage on the multifunction A0 input (connection 120c) is less than VIH, max; a permanent (PSWP) memory write protection can occur. Thus inadvertent permanent (PSWP) memory write protection cannot accidentally occur, according to the teachings of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having a nonvolatile programmable memory, comprising:
    nonvolatile memory;
    memory control and programming logic coupled to the nonvolatile memory and adapted for writing data to the nonvolatile memory, wherein said memory control and programming logic (104) is operable to determine whether a write protection function is to be performed from signals supplied to at least one input connection;

at least one multifunction input connection coupled to the memory control and programming logic, wherein the at least one multifunction input connection is used to distinguish between a permanent and a temporary write protection of the data written to the nonvolatile memory; wherein the permanent write protection is enabled when a voltage on the at least one multifunction input connection is less than a first voltage value, and the temporary write protection is enabled when the voltage on the at least one multifunction input connection is greater than a second voltage value, the second voltage value being greater than the first voltage value; and wherein the write protection cannot be enabled when the voltage on the at least one multifunction input connection is equal to or greater than the first voltage value and less than or equal to the second voltage value.

2. The integrated circuit device, according to claim 1, wherein the first voltage value is substantially equal to about one-half volt more than a power source voltage.

3. The integrated circuit device, according to claim 1, wherein the second voltage value is substantially equal to about 4.8 volts more than a power source voltage.

4. The integrated circuit device, according to claim 1, wherein the second voltage value is substantially equal to about seven volts.

5. The integrated circuit device, according to claim 1, wherein the permanent write protection comprises programming a permanent write-protect fuse.

6. The integrated circuit device, according to claim 1, wherein the temporary write protection comprises programming a temporary write-protect fuse.

7. The integrated circuit device, according to claim 1, wherein the memory control and programming logic comprises:

a programming level detection circuit, wherein the programming level detection circuit determines when the voltage on the at least one multifunction input connection is less than the first voltage value, the voltage on the at least one multifunction input connection is equal to or greater than the first voltage value and less than or equal to the second voltage, and the voltage on the at least one multifunction input connection is greater than the second voltage; and logic for allowing the permanent write protection, not allowing the permanent and the temporary write protection, and allowing the temporary write protection depending on the voltage on the at least one multifunction input connection.

8. The integrated circuit device, according to claim 1, further comprising a digital processor coupled to the nonvolatile memory.

9. The integrated circuit device, according to claim 8, further comprising digital circuits coupled to the digital processor and at least one digital input-output connection.

10. The integrated circuit device, according to claim 9, wherein the at least one digital input-output connection is a multifunction input-output connection.

11. The integrated circuit device, according to claim 8, further comprising analog circuits coupled to the digital processor and at least one analog input-output connection.

12. The integrated circuit device, according to claim 11, wherein the at least one analog input-output connection is a multifunction input-output connection.

13. A method for preventing unintended permanent write-protection of a nonvolatile programmable memory in an integrated circuit device, said method comprising:

determining whether a write protection function is to be performed from signals applied to a plurality of input connections of an integrated circuit device;

comparing a voltage on an input of a multifunction input connection of the integrated circuit device to first and second voltage values, wherein the second voltage value is greater than the first voltage value;

if the voltage on the input of the multifunction input connection is less than the first voltage value, then allow permanent write protection of a programmable memory in the integrated circuit device;

if the voltage on the input of the multifunction input connection is greater than the second voltage value, then allow temporary write protection of the programmable memory in the integrated circuit device; and if the voltage on the input of the multifunction input connection is equal to or greater than the first voltage value and less then or equal to the second voltage, then do not allow write protection of the programmable memory.

* * * * *